(12) United States Patent
Li

(10) Patent No.: US 11,108,415 B2
(45) Date of Patent: Aug. 31, 2021

(54) METHOD OF VITERBI ALGORITHM AND RECEIVING DEVICE

(71) Applicant: ALi Corporation, Hsinchu (TW)

(72) Inventor: Lin Li, Hsinchu (TW)

(73) Assignee: ALi Corporation, Hsinchu (TW)

( * ) Notice: Subject to any disclaimer, the term of this patent is extended or adjusted under 35 U.S.C. 154(b) by 73 days.

(21) Appl. No.: 16/691,624

(22) Filed: Nov. 22, 2019

(65) Prior Publication Data
US 2020/0274557 A1 Aug. 27, 2020

(30) Foreign Application Priority Data
Feb. 26, 2019 (CN) .......................... 201910141323.5

(51) Int. Cl.
| | | |
|---|---|---|
| *H03M 13/41* | (2006.01) |
| *H03M 13/27* | (2006.01) |
| *H03M 13/29* | (2006.01) |
| *H03M 13/39* | (2006.01) |

(52) U.S. Cl.
CPC ... *H03M 13/4107* (2013.01); *H03M 13/2732* (2013.01); *H03M 13/2939* (2013.01); *H03M 13/3961* (2013.01); *H03M 13/4138* (2013.01); *H03M 13/4184* (2013.01)

(58) Field of Classification Search
CPC ......... H03M 13/4107; H03M 13/2732; H03M 13/2939; H03M 13/3961; H03M 13/4138; H03M 13/4184
See application file for complete search history.

(56) References Cited

U.S. PATENT DOCUMENTS

| | | | | | |
|---|---|---|---|---|---|
| 4,823,346 | A | * | 4/1989 | Kobayashi | ............ H03M 13/25 714/794 |
| 5,416,787 | A | * | 5/1995 | Kodama | ........... H03M 13/3961 714/774 |

(Continued)

FOREIGN PATENT DOCUMENTS

| | | | | |
|---|---|---|---|---|
| CN | 102386935 | A | * | 3/2012 |
| CN | 101262233 | B | * | 9/2012 |

(Continued)

OTHER PUBLICATIONS

Convolutional Coder Software Implementation using Viterbi decoding algorithm (Year: 2008).*

(Continued)

*Primary Examiner* — Guy J Lamarre

(57) ABSTRACT

The invention discloses a method and a receiving device of the Viterbi algorithm. The method is applicable for a Viterbi decoder that receives an output signal generated by a convolution code encoder processing an original signal. The convolution code encoder includes M registers and M is a positive integer greater than or equal to 2. The method includes the following steps. First, for the first to the Mth data of the output signal, the Viterbi decoder performs the add-compare-select operation based on the known M initial values of the M registers. Then, for the Mth-last to the last data of the output signal, the Viterbi decoder performs the add-compare-select operation based on the known last M bits values of the original signal, thereby reducing the computational complexity of the add-compare-select unit.

2 Claims, 8 Drawing Sheets

For the first to the Mth data of the output signal, the Viterbi decoder performs the add-compare-select operation in the Viterbi algorithm based on the known M initial values of the M registers — S410

For the Mth-last to the last data of the output signal, the Viterbi decoder performs the add-compare-select operation in the Viterbi algorithm based on the known last M bits values of the original signal — S420

(56) References Cited

U.S. PATENT DOCUMENTS

| | | | | |
|---|---|---|---|---|
| 7,822,138 B2 * | 10/2010 | Zaboronski | ......... | H03M 13/395 |
| | | | | 375/265 |
| 8,255,780 B2 * | 8/2012 | Saha | ................ | H03M 13/6362 |
| | | | | 714/792 |
| 2006/0048037 A1 * | 3/2006 | Solomon | ........... | H03M 13/4161 |
| | | | | 714/792 |
| 2009/0125794 A1 * | 5/2009 | Li | ..................... | H03M 13/6337 |
| | | | | 714/795 |
| 2020/0382133 A1 * | 12/2020 | Myung | ................ | H03M 13/09 |

FOREIGN PATENT DOCUMENTS

| | | | | |
|---|---|---|---|---|
| CN | 102932014 A | * | 2/2013 | |
| CN | 103546170 A | * | 1/2014 | |
| CN | 103986477 A | * | 8/2014 | |
| CN | 102761342 B | * | 12/2016 | |
| JP | 12018207248 A | * | 12/2018 | |

OTHER PUBLICATIONS

An effective Simplifying Scheme for Viterbi Decoder (Year: 1991).*
An improved pipelined MSB-First Add-compare Select Unit Structue for Viterbi Decoders (Year: 2004).*
Implementing the Viterbi Algorithm (Year: 1995).*
Khalifa et al., "Convolution Coder Software Implementation Using Vliterbi Decoding Algorithm," IEEE, pp. 1-9, May 23, 2008 (Year: 2008).*

* cited by examiner

METHOD OF VITERBI ALGORITHM AND RECEIVING DEVICE

FIELD OF THE INVENTION

The present invention relates to a Viterbi algorithm, and more particularly to a method and a receiving device of a Viterbi algorithm.

BACKGROUND OF THE INVENTION

Convolution code is a common channel coding technique. In the field of telecommunications, the convolution code is an error-correction code, and the original signals sequentially enter from the input terminal to the registers of the convolution code encoder during the process of encoding. Each register can store a bit value. The bit value in a register will be bit-shifted to the next register, and these bit values stored in the registers, which correspond to different time points, can be calculated for convolutional encoding, and then the output signal obtained by the encoding operation will be transmitted to the output terminal. Since the original signals are sequentially input to the registers of the convolution code encoder, each convolution code data is related to the previous original signals, and therefore the convolution code can have the memory property for maintaining channel information. Also, for the existing convolution code, the Viterbi algorithm is one of the most widely used algorithms for decoding.

The Viterbi algorithm generally uses a trellis diagram representing states of the encoder. The Viterbi decoder can generate the first decoding bit only when the decoding process proceeds to a deeper part of the trellis diagram. Therefore in the conventional method, the length D of the survivor path to be traced back by the Viterbi decoder is usually greater than or equal to 5 times of a constraint length K. For example, if the constraint length K in Wi-Fi is 7, then the length D of the survivor path for tracing back is preferably 35. However, some telecom standards have shorter signaling lengths. For example, the legacy mode signal field (L-SIG) has only 24 bits. Therefore, the length D of the survivor path for tracing back is not long enough, and thus, the error bit rate of the convolution code is affected.

SUMMARY OF THE INVENTION

Based on the common knowledge in the art, the above various preferred conditions can be arbitrarily combined to obtain preferred embodiments of the present invention.

In view of this, an embodiment of the present invention provides a method and a receiving device of the Viterbi algorithm which are applicable for the Viterbi decoder. The Viterbi decoder receives an output signal generated by a convolution code encoder processing an original signal. The convolution code encoder has M registers which M is a positive integer greater than or equal to 2. The method includes the following steps. First, for the first to the Mth data of the output signal, the Viterbi decoder performs the add-compare-select operation in the Viterbi algorithm based on the known M initial values of the M registers. Then, for the Mth-last to the last data of the output signal, the Viterbi decoder performs the add-compare-select operation in the Viterbi algorithm based on the known last M bits values of the original signal. In addition, an embodiment of the present invention further provides a receiving device including a Viterbi decoder and a storage device. The Viterbi decoder is used for receiving an output signal generated by a convolution code encoder processing an original signal, and uses the Viterbi algorithm to decode the output signal. The storage device stores an application program. The application program is used for indicating the method of the Viterbi algorithm in the embodiment for the Viterbi decoder to execute.

Other objects and advantages of the present invention will become apparent from the technical features disclosed herein. In order to make the above and other objects, features, and advantages of the present invention more apparent, the embodiments will be described in detail with reference to the drawings.

DETAILED DESCRIPTION OF PREFERRED EMBODIMENTS

Figure 1:
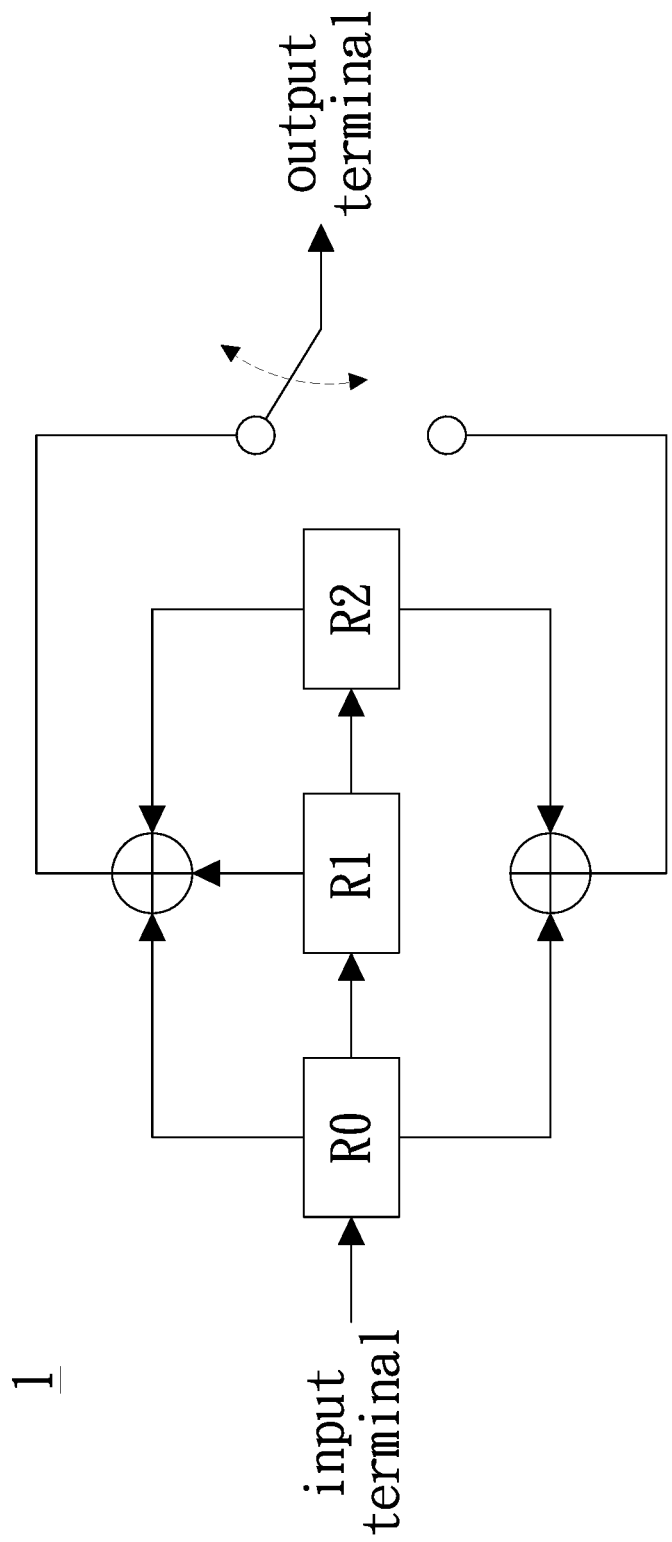
FIG. 1 is a schematic function block diagram of a convolution code encoder according to an embodiment of the invention.

Hereinafter, the present invention will be described in detail by explaining various embodiments of the invention with reference to the drawings. However, the concept of the invention may be embodied in many different forms and should not be limited to the illustrative embodiments in the description. In addition, the same reference numerals in the drawings can represent the similar components.

In detail, the method of the Viterbi algorithm provided by the embodiment of the present invention may be suitable for a Viterbi decoder in any telecommunication standard. For example, the telecommunication standard may be the IEEE 802.11n or the IEEE 802.11ac, etc., but the invention is not limited thereto. Furthermore, according to the prior art, the Viterbi decoder is used for receiving an output signal generated by a convolution code encoder processing an original signal, and the Viterbi algorithm is used for decoding the output signal, but the present invention does not limit the specific implementation of the Viterbi decoder or the convolution code encoder which can be adaptively designed by those skilled in the art according to actual requirements or applications. Basically, the convolution code encoder has M registers, and M is a positive integer greater than or equal to 2.

Embodiment 1

For convenience of the following description, the present embodiment will be described by a convolution code encoder of (n, k, M)=(2, 1, 3), but it is not intended to limit the present invention. It should be understood that the mentioned n and k respectively represent the number of output bits and the number of input bits of the convolution code encoder. For example, please refer to FIG. 1. FIG. 1 is a schematic functional block diagram of a convolution code encoder provided by an embodiment of the present invention. As shown in FIG. 1, the convolution code encoder 1 is composed of three registers R0, R1, R2 and two adders for performing an encoding operation of one input and two outputs. It can be understood that each of the registers R0, R1 and R2 can store one bit value. Whenever a bit value of the original signal (not shown) enters the register R0 from the input terminal, the bit values in the registers will be bit-shifted to the next register, and the bit values stored in the registers can be calculated for convolutional encoding, and then the output signal obtained by the encoding operation will be transmitted to the output terminal. Since the operation of the convolution code encoder is well known to those of ordinary skill in the art, no redundant detail is to be given herein.

Embodiment 2

Figure 2:
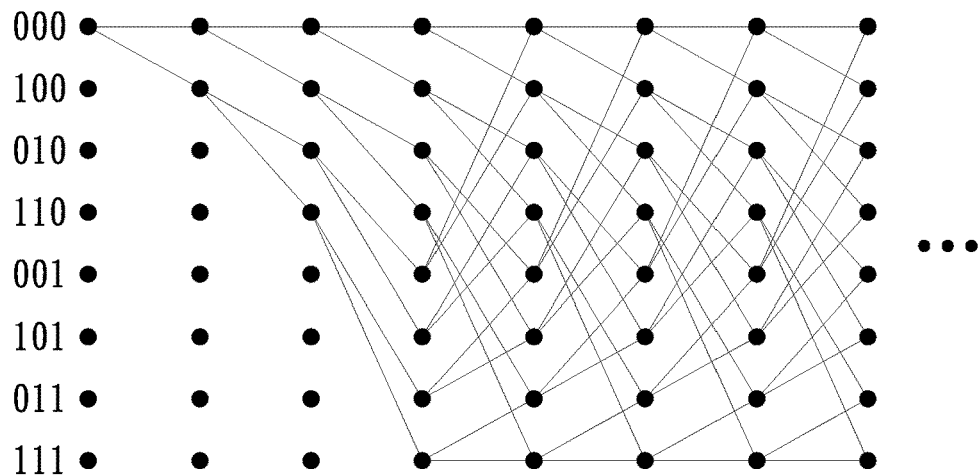
FIG. 2 is a schematic diagram of a trellis diagram of the encoding by the convolution code encoder of FIG. 1 according to a preferred embodiment.
Figure 3:
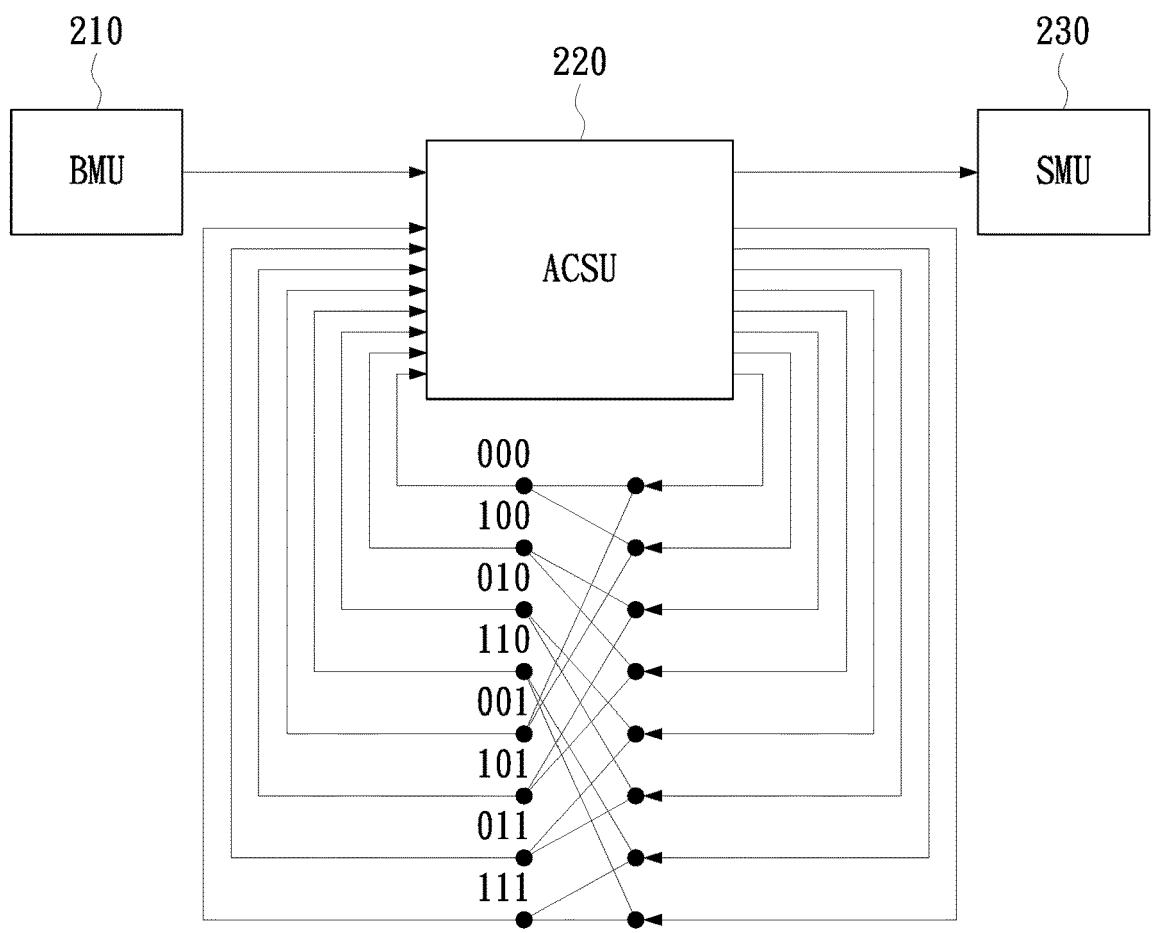
FIG. 3 is a schematic function block diagram of a Viterbi decoder provided by an embodiment of the present invention.

In addition, in a preferred embodiment, assuming that the bit values stored in each of the registers R0, R1 and R2 are initially "0", according to the encoding mode of FIG. 1, the present embodiment may further generate an encoding trellis diagram as shown in FIG. 2. In the trellis diagram of FIG. 2, the convolution code encoder 1 takes "000" as the initial state, and the relationship of all possible generated states and time-step changes is also illustrated respectively on the vertical and horizontal axes of FIG. 2. Next, please refer to FIG. 3. FIG. 3 is a schematic functional block diagram of a Viterbi decoder provided by an embodiment of the present invention. As shown in FIG. 3, the Viterbi decoder 2 mainly includes a branch metric unit (BMU) 210, an add-compare-select unit (ACSU) 220, and a survivor path memory unit (SMU) 230.

Briefly, when the branch metric unit 210 receives a new data, the branch metric unit 210 will calculate the branch distance associated with the data, and the add-compare-select unit 220 will continuously update the shortest branch distance of each state after performing the add-compare-select operation. Besides, the survivor path memory unit 230 records the decision result of the add-compare-select unit 220, and traces back the survivor path to find the decoded bits. According to the above teachings, those of ordinary skill in the art can understand that the add-compare-select unit 220 is the most significant part of the circuit or application program to execute the Viterbi algorithm. Also, the computational complexity of the add-compare-select unit 220 increases exponentially according to the number of registers used by the convolution code encoder.

Therefore, as shown in FIG. 3, since the Viterbi decoder 2 is used for decoding the output signal generated by the convolution code encoder 1 of FIG. 1, the add-compare-select unit 220 will always compare 2M states, that is, 8 states, to find the best path every time when the Viterbi decoder 2 receives a data of the output signal. Since the operation of the Viterbi decoder 2 is also known to those of ordinary skill in the art, no redundant detail is to be given herein. In summary, the method of the present embodiment is to reduce the computational complexity of the add-compare-select unit 220 compared to the prior art.

Further, under certain telecommunication standards, in addition to setting the M initial values of the M registers to be "0", M "0" are added to the end of signaling or data packet of the telecommunication standard as the tail bits of the original signal. As such, the M registers can be restored to the initial state "000" after the end of the encoding. Alternatively, the receiving end may know the M initial values of the M registers and the last M bits values of the original signal in advance under certain telecommunication standards. Thus, the method of the present embodiment is based on the known coding characteristics to perform special process on initial states and end states of the trellis diagrams.

Embodiment 3

Figure 4:
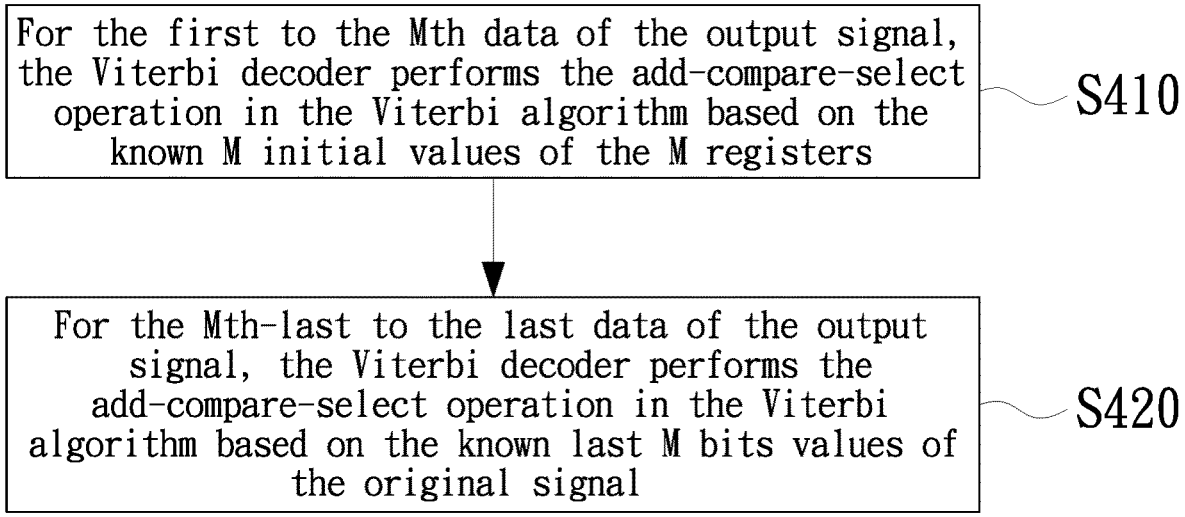
FIG. 4 is a schematic flow chart of the method of the Viterbi algorithm according to an embodiment of the present invention.

Please refer to FIG. 4. FIG. 4 is a schematic flow chart of the method of the Viterbi algorithm according to an embodiment of the present invention.

First, in step S410, for the first to the Mth data of the output signal, the Viterbi decoder performs the add-compare-select operation in the Viterbi algorithm based on the known M initial values of the M registers. Thereafter, in step S420, for the Mth-last to the last data of the output signal, the Viterbi decoder performs the add-compare-select operation in the Viterbi algorithm based on the known last M bits values of the original signal. For the convenience of the following description, the embodiment of FIG. 4 will also be explained by using the Viterbi decoder 2 with Radix-2 and the convolution code encoder 1 with (n, k, M)=(2, 1, 3), but the present invention is not limited thereto.

Figure 5A:
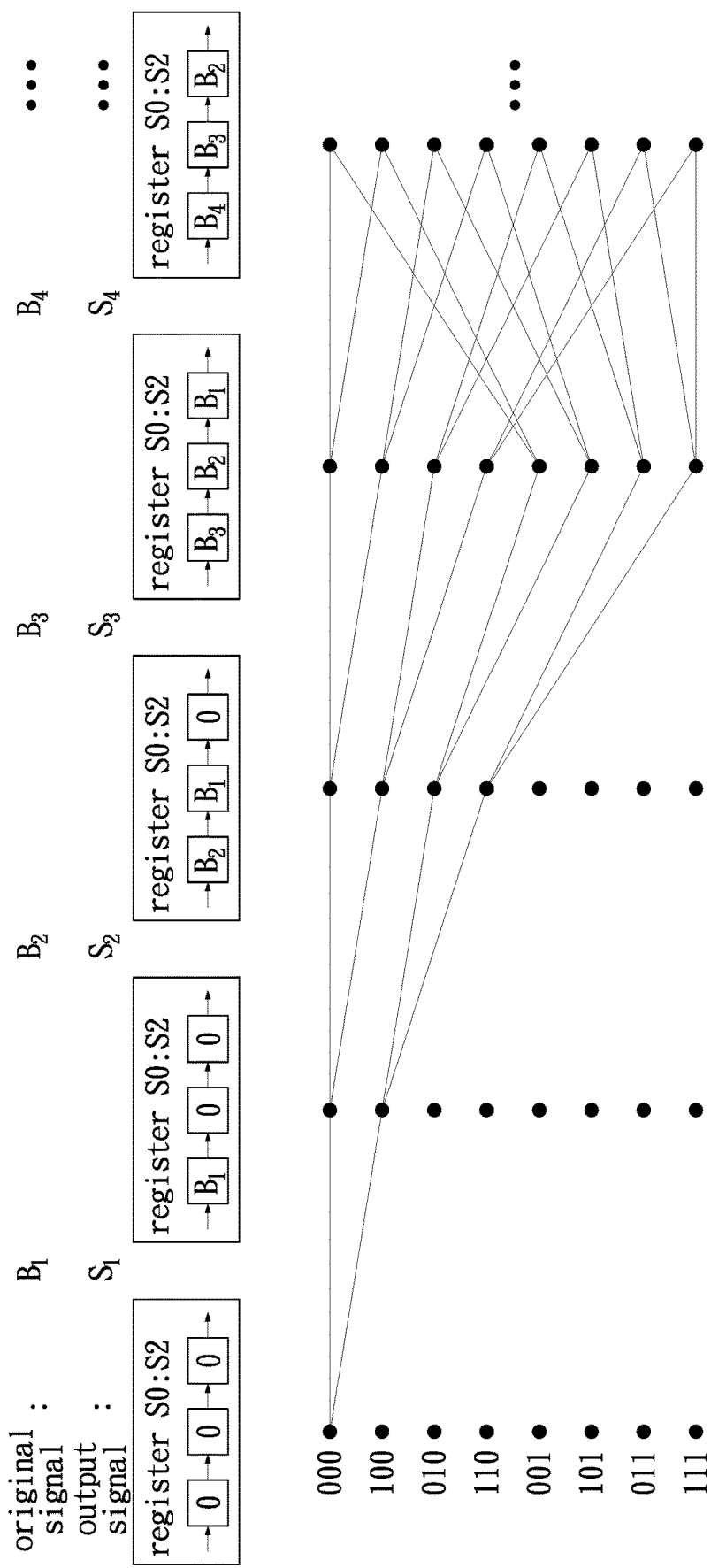
FIG. 5A and FIG. 5B are schematic diagrams showing the step S410 and step S420 of the method of FIG. 4 according to a preferred embodiment.
Figure 5B:
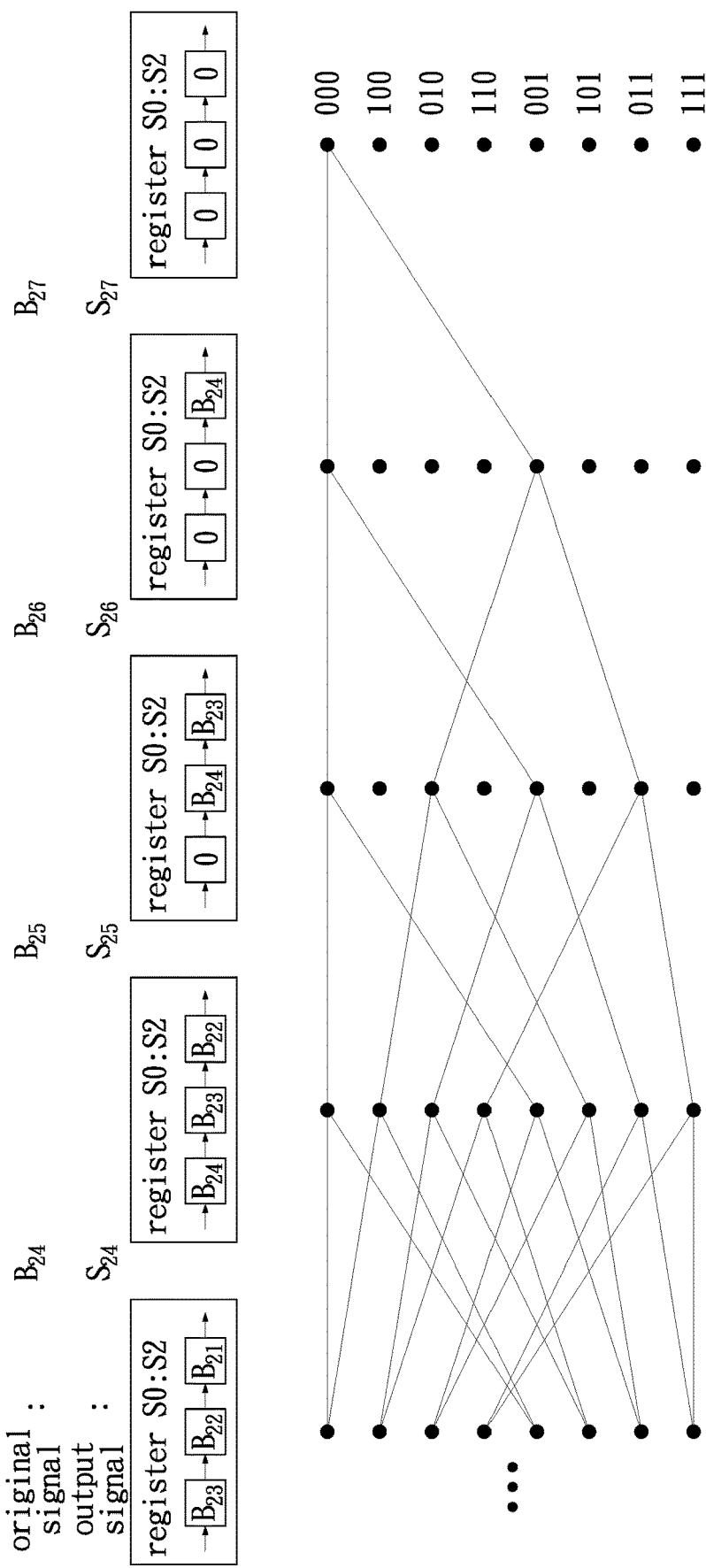

Next, please refer to FIG. 5A and FIG. 5B together. FIG. 5A and FIG. 5B are schematic diagrams showing the step S410 and step S420 of the method of FIG. 4 according to a preferred embodiment. For the flowing description, it is assumed that the Viterbi decoder 2 already knows the three initial values of the three registers R0, R1, R2 and the last three bits values of the original signal are all "0", but it is not intended to limit the present invention. That is, during the encoding process, when the first bit value B1 of the original signal enters the register R0 from the input terminal, the initial values "0" in the registers R0 and R1 are respectively bit-shifted to the next registers R1 and R2, and the bit values stored in the registers can be calculated for encoding operation, and then the first data S1 of the output signal obtained by the encoding operation is transmitted to the output terminal. Therefore, as shown in FIG. 5A, when receiving the first data S1 of the output signal, the Viterbi decoder 2 can know that it is converted from the initial state "000" to "B100" in the trellis diagram at the time of encoding. Also, since the first bit value B1 of the original signal may be "0" or "1", at this moment the add-compare-select unit 220 only needs to select the two states "000" and "100" corresponding to the state "B100" to perform the add-compare-select operation, and does not need to perform the add-compare-select operation on all the eight states. Of course, since the Viterbi decoder 2 can know that the state "000" or "100" at this moment is changed from the initial state "000" at the previous moment, the add-compare-select unit 220 only needs to consider selecting the path in which the state "000" changes to the state "000" or "100" as the survivor path at this moment.

Similarly, when the second bit value $B_2$ of the original signal enters the register R0 from the input terminal, the first bit value $B_1$ in the register R0 and the initial value "0" in the register R1 are respectively bit-shifted to the next registers R1 and R2, and the bit values stored in the registers can be calculated for encoding operation, and then the second data $S_2$ of the output signal obtained by the encoding operation is transmitted to the output terminal. Therefore, when receiving the second data $S_2$ of the output signal, the Viterbi decoder 2 can know that it is converted from the state "$B_1$00" to "$B_2B_1$0" in the trellis diagram at the time of encoding. Also, since the second bit value $B_2$ of the original signal may be "0" or "1", at this moment the add-compare-select unit 220 only needs to select the four states "000", "100", "010" and "110" corresponding to the state "$B_2B_1$0" to perform the add-compare-select operation. Accordingly, the add-compare-select unit 220 only needs to consider selecting the path in which the state "000" changes to the state "000" or "100" or the path in which the state "100" to the state "010" or "110" as the survivor path at this moment. By analogy, when receiving the third data $S_3$ of the output signal, the Viterbi decoder 2 can know that it is converted from the state "$B_2B_1$0" to "$B_3B_2B_1$" in the trellis diagram at the time of encoding. Thus, at this moment, the add-compare-select unit 220 needs to perform add-compare-select operation on all the eight states. However, the add-compare-select unit 220 may only consider selecting the path in which the state "000" changes to the state "000" or "100", the path in which the state "100" changes to the state "010" or "110", the path in which the state "010" changes to the state "001" or "101", or the path in which the state "110" changes to the state "011" or "111" as the survivor path at this moment, as shown in FIG. 5A.

Similarly, when the third-last bit value (e.g., $B_{25}$) of the original signal enters the register R0 from the input terminal, the bit values $B_{24}$ and $B_{23}$ in the registers R0 and R1 are respectively bit-shifted to the next registers R1 and R2, and the bit values stored in the registers can be calculated for encoding operation, and the third-last data $S_{25}$ of the output signal obtained by the encoding operation is transmitted to the output terminal. Therefore, as shown in FIG. 5B, when receiving the third-last data $S_{25}$ of the output signal, the Viterbi decoder 2 can know that it is converted from the state "$B_{24}B_{23}B_{22}$" to "$B_{25}B_{24}B_{23}$" in the trellis diagram at the time of encoding. Also, since the third-last bit value $B_{25}$ of the original signal is known as "0", at this moment the add-compare-select unit 220 only needs to select the four states "000", "010", "001" and "011" corresponding to the state "0$B_{24}B_{23}$" to perform the add-compare-select operation, and does not need to perform the add-compare-select operation on all the eight states.

Similarly, when the penultimate bit value $B_{26}$ of the original signal enters the register R0 from the input terminal, the bit values $B_{25}$ and $B_{24}$ in the registers R0 and R1 are again respectively bit-shifted to the next registers R1 and R2, and the bit values stored in the registers can be calculated for encoding operation, and then the third-last data $S_{25}$ of the output signal obtained by the encoding operation is transmitted to the output terminal. Therefore, as shown in FIG. 5B, when receiving the penultimate data $S_{26}$ of the output signal, the Viterbi decoder 2 can know that it is converted from the state "0$B_{24}B_{23}$" to "$B_{26}$0$B_{24}$" in the trellis diagram at the time of encoding. Also, since the penultimate bit value $B_{26}$ of the original signal is also known as "0", at this moment the add-compare-select unit 220 only needs to select the two states "000" and "001" corresponding to the state "00$B_{24}$" to perform the add-compare-select operation. By analogy, when receiving the last data $S_{27}$ of the output signal, the Viterbi decoder 2 can know that it is converted from the state "00$B_{24}$" to the initial state "000" in the trellis diagram at the time of encoding. Thus, at this moment the add-compare-select unit 220 only needs to select the state "000" to perform the add-compare-select operation.

Figure 6A:
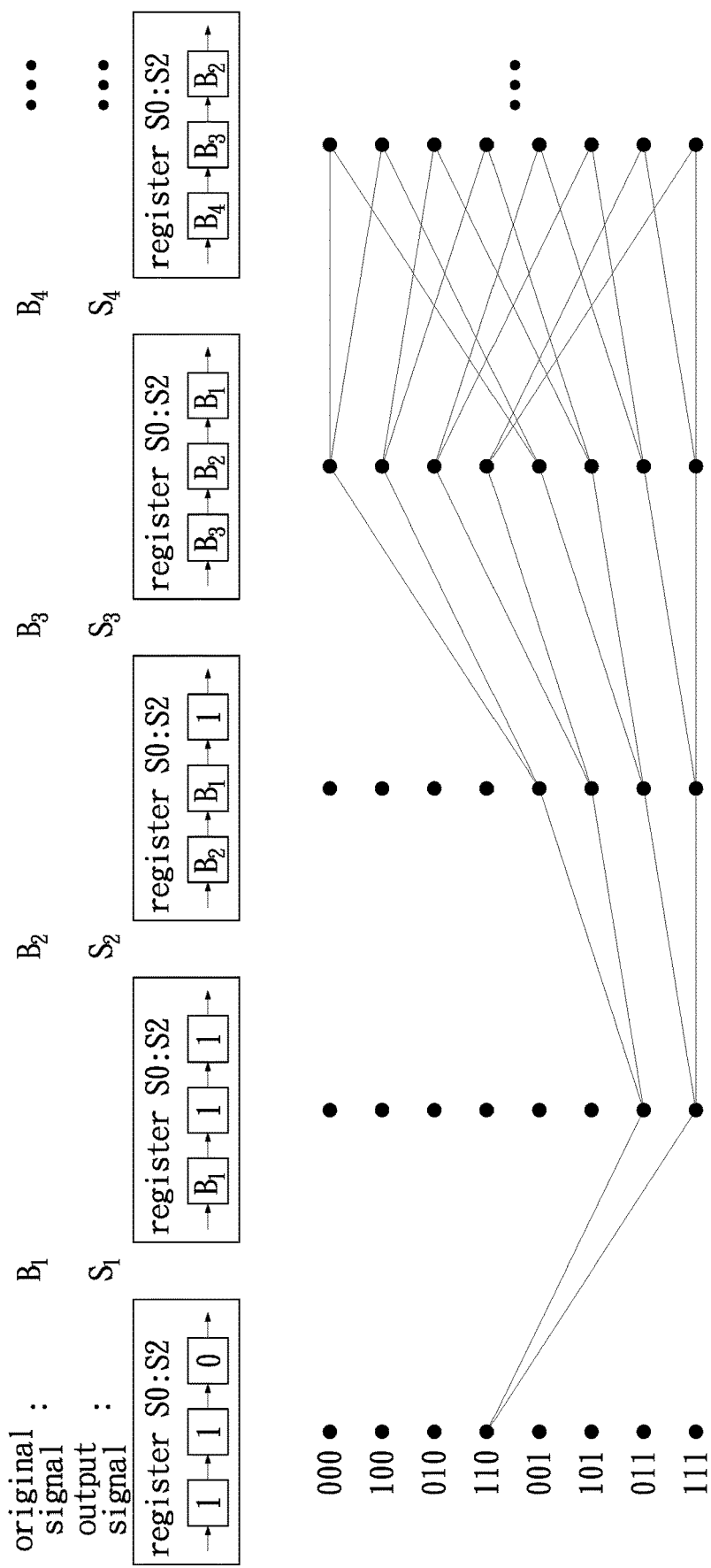
FIG. 6A and FIG. 6B are schematic diagrams showing the step S410 and step S420 of the method of FIG. 4 according to another preferred embodiment.
Figure 6B:
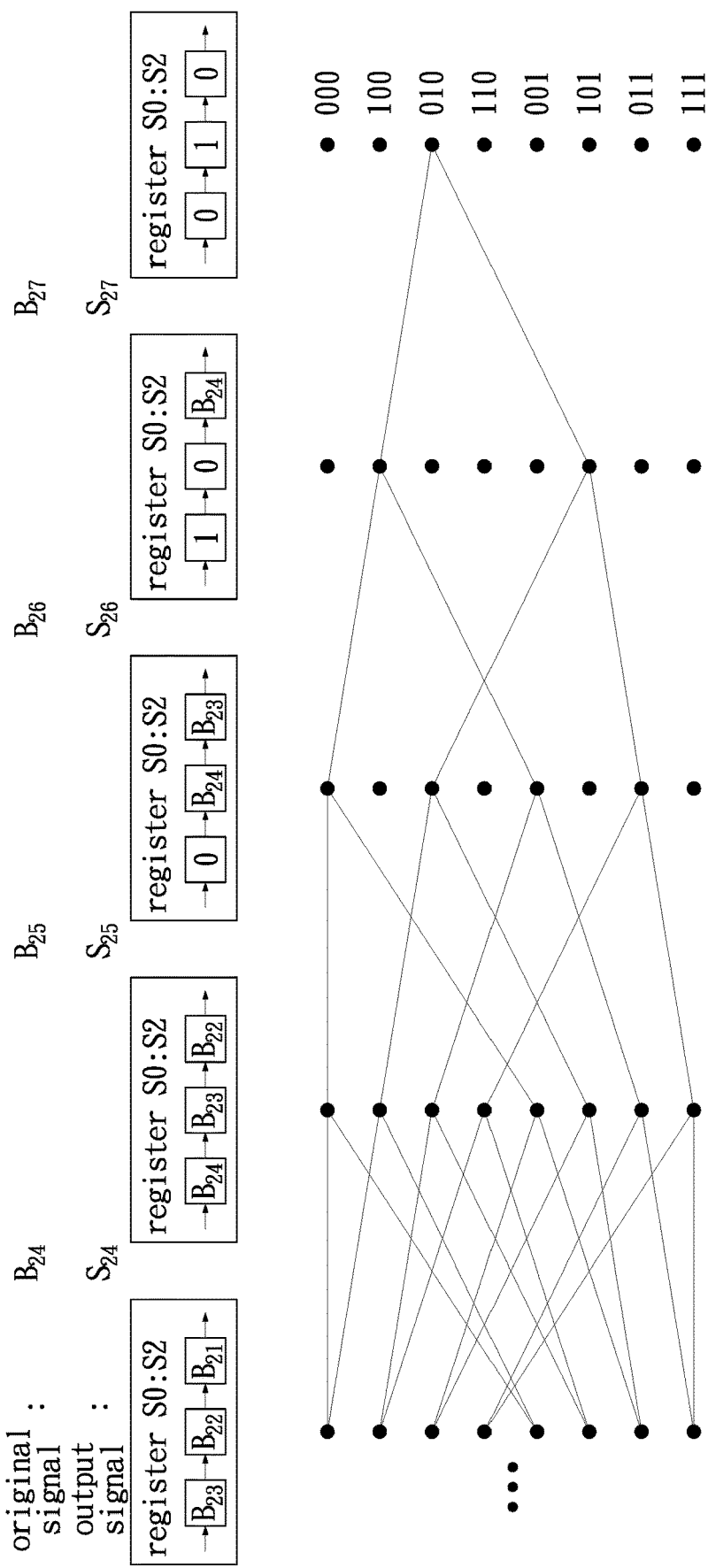

On the other hand, it is considered that the receiving end of some telecommunication standards may know the three initial values of the three registers R0, R1 and R2 and the last three bit values of the original signal, but the last three bits values of the original signal and the three initial values of the three registers R0, R1 and R2 are not all set to "0". In this condition, please refer to FIG. 6A and FIG. 6B together. FIG. 6A and FIG. 6B are schematic diagrams showing the step S410 and step S420 of the method of FIG. 4 according to another preferred embodiment. In the embodiment of FIG. 6A and FIG. 6B, it is assumed that the Viterbi decoder 2 knows that the three initial values of the three registers R0, R1 and R2 are respectively "110", and the last three bits values of the original signal are respectively "010", but the invention is not limited thereto.

Herein, as shown in FIG. 6A, when receiving the first data $S_1$ of the output signal, the Viterbi decoder 2 can know that it is converted from the state "110" to "$B_1$11" in the trellis diagram at the time of encoding. Also, since the first bit value $B_1$ of the original signal may be "0" or "1", at this moment the add-compare-select unit 220 only needs to select the two states "011" and "111" corresponding to the state "$B_1$11" to perform the add-compare-select operation, and does not need to perform the add-compare-select operation on all the eight states. Of course, since the Viterbi decoder 2 can know that the state "011" or "111" at this moment is changed from the initial state "110" at the previous moment, the add-compare-select unit 220 only needs to consider selecting the path in which the state "110" to state "011" or "111" as the survivor path at this moment.

Similarly, when receiving the second data $S_2$ of the output signal, the Viterbi decoder 2 can know that it is converted from the state "$B_1$11" to "$B_2B_1$1" in the trellis diagram at the time of encoding. Also, since the second bit value $B_2$ of the original signal may be "0" or "1", at this moment the add-compare-select unit 220 only needs to select the four states "001", "101", "011" and "111" corresponding to the state "$B_2B_1$1" to perform the add-compare-select operation. Accordingly, the add-compare-select unit 220 only needs to consider selecting the path in which the state "011" changes to the state "001" or "101" or the path in which the state "111" changes to the state "011" or "111" as the survivor path at this moment. By analogy, when receiving the third data $S_3$ of the output signal, the Viterbi decoder 2 can know that it is converted from the state "$B_2B_1$1" to "$B_3B_2B_1$" in the trellis diagram at the time of encoding. Thus, at this moment the add-compare-select unit 220 needs to perform add-compare-select operation on all the eight states. However, the add-compare-select unit 220 may only consider selecting the path in which the state "001" changes to the state "000" or "100", the path in which the state "100" changes to the state "010" or "110", the path in which the state "011" changes to the state "001" or "101", or the path in which the state "111" changes to the state "011" or "111" as the survivor path at this moment, as shown in FIG. 6A.

Similarly, as shown in FIG. 6B, when receiving the third-last data (e.g., $S_{25}$) of the output signal, the Viterbi decoder 2 can know that it is converted from the state "$B_{24}B_{23}B_{22}$" to "$B_{25}B_{24}B_{23}$" in the trellis diagram at the time of encoding. Also, since the third-last bit value $B_{25}$ of the original signal is known as "0", at this moment the add-compare-select unit 220 only needs to select the four states "000", "010", "001" and "011" corresponding to the state "0$B_{24}B_{23}$" to perform the add-compare-select operation, and does not need to perform the add-compare-select operation on all the eight states. Similarly, when receiving the penultimate data $S_{26}$ of the output signal, the Viterbi decoder 2 can know that it is converted from the state "$0B_{24}B_{23}$" to "$B_{26}0B_{24}$" in the trellis diagram at the time of encoding. Also, since the penultimate bit value $B_{26}$ of the original signal is also known as "0", at this moment the add-compare-select unit 220 only needs to select the two states "000" and "001" corresponding to the state "$00B_{24}$" to perform the add-compare-select operation. By analogy, when receiving the last data $S_{27}$ of the output signal, the Viterbi decoder 2 can know that it is converted from the state "$10B_{24}$" to "$B_{27}10$" in the trellis diagram at the time of encoding. Also, because the last bit value $B_{27}$ of the original signal is known as "0", at this moment, the add-compare-select unit 220 only needs to select the state "010" to perform the add-compare-select operation.

That is, as long as the Viterbi decoder 2 already knows the three initial values of the three registers R0, R1, R2 and the last three bits values of the original signal, the method of the embodiment can reduce the computational complexity of the add-compare-select unit 220 preceding the first three data and the last three data of the output signal based on the known coding characteristics. Especially in the case where the original signal length is not long enough, the method of the embodiment can cause the survivor path to converge to the initial state of the registers R0, R1 and R2 more quickly, or can help the Viterbi decoder 2 to find the best decoding path faster. In addition, based on the Viterbi decoder 2 with Radix-2 described by the present embodiment, those of ordinary skill in the art should be able to clearly understand the operation of the Viterbi decoder with other higher dimensions, such as Radix-4.

In summary, if the Viterbi decoder of the present embodiment takes Radix-$2^i$ as the radix, wherein i is a positive integer greater than or equal to 1, then the step S410 of FIG. 4 may include: performing, by the Viterbi decoder, the add-compare-select operation for the first to the Mth data of the output signal by sequentially shifting the known M initial values of the known M registers out of the M registers by i and selecting the states corresponding to this shift from $2^M$ states included in the M registers. Similarly, step S420 of FIG. 4 may accordingly include: performing, by the Viterbi decoder, the add-compare-select operation for the Mth-last to the last data of the output signal by sequentially shifting the known last M bits values of the original signal into the M registers by i and selecting the states corresponding to this shift from $2^M$ states included in the M registers. Since the detail descriptions have been described similarly as above, no redundant detail is to be given herein.

Embodiment 4

Figure 7:
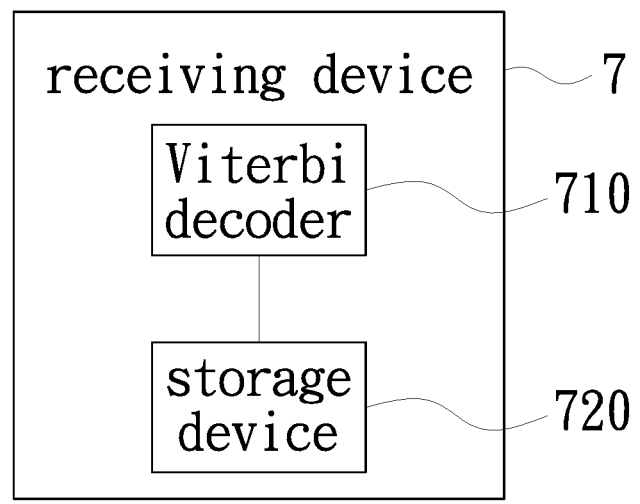
FIG. 7 is a schematic function block diagram of a receiving device according to an embodiment of the present invention.

Finally, in order to further explain the implementation of the method, the invention further provides an embodiment of the receiving device. Please refer to FIG. 7. FIG. 7 is a schematic functional block diagram of a receiving device according to an embodiment of the present invention. However, the receiving device 7 described below is just one of the implementations of the method, and is not intended to limit the present invention. As shown in FIG. 7, the receiving device 7 includes a Viterbi decoder 710 and a storage device 720, wherein the Viterbi decoder 710 can be, for example, the Viterbi decoder 2 of FIG. 3, but the present invention is not limited thereto. In addition, according to the prior art, the method of FIG. 4 can be implemented by an application program (not shown) having a plurality of instructions. Accordingly, the application program is stored in storage device 720 and is used to instruct the Viterbi decoder 710 to perform the method of FIG. 4.

That is, the receiving device 7 can initiate to execute the method of FIG. 4 after the receiving device 7 installs the application program. It should be noted that the present invention does not limit the specific implementation of the receiving device 7 installing the application program and executing the method of FIG. 4. Those of ordinary skill in the art should be able to make relevant designs based on actual requirements or applications. In addition, the storage device 720 may be directly integrated into the receiving device 7, as shown in FIG. 7, or separately disposed outside the receiving device 7. In summary, the present invention also does not limit the specific implementation of the storage device 720. Since the detail descriptions have been described similarly as above, no redundant detail is to be given herein.

In summary, the method and receiving device of the Viterbi algorithm provided by the embodiments of the present invention can effectively reduce the computational complexity of the add-compare-select unit, especially when the original signal length is not long enough. The method of the embodiments enables the survivor path to converge to the initial state of the register more quickly, in other words, it helps the Viterbi decoder to find the best decoding path faster.

The above descriptions are merely embodiments of the present invention, and are not intended to limit the scope of the invention.

What is claimed is:

1. A method of Viterbi algorithm applicable for a Viterbi decoder, wherein the Viterbi decoder receives an output signal generated by a convolution code encoder processing an original signal, and the convolution code encoder comprises M registers, M is a positive integer greater than or equal to 2, and the method comprises steps of:
  performing, by the Viterbi decoder, an add-compare-select operation in the Viterbi algorithm for first to Mth data of the output signal based on known M initial values of the M registers; and
  performing, by the Viterbi decoder, the add-compare-select operation in the Viterbi algorithm for Mth-last to last data of the output signal based on known last M bits values of the original signal;
  wherein the Viterbi decoder takes Radix-$2^i$ as radix, i is a positive integer greater than or equal to 1, and the step of performing, by the Viterbi decoder, the add-compare-select operation in the Viterbi algorithm for the first to the Mth data of the output signal based on the known M initial values of the M registers comprises a step of:
  performing, by the Viterbi decoder, the add-compare-select operation for the first to the Mth data of the output signal by sequentially shifting the known M initial values of the known M registers out of the M registers by i and selecting a first possible state corresponding to the shifting from $2^M$ states included in the M registers, rather than performing the add-compare-select operation on all the $2^M$ states, wherein some of bit values of the first possible state are the same as the rest of bit values after each shifting;
  wherein the step of performing, by the Viterbi decoder, the add-compare-select operation in the Viterbi algorithm for the Mth-last to the last data of the output signal based on the known last M bits values of the original signal comprises a step of:
  performing, by the Viterbi decoder, the add-compare-select operation for the Mth-last to the last data of the output signal by sequentially shifting the known last M bits values of the original signal into the M registers by i and selecting a second possible state corresponding to the shifting from the $2^M$ states included in the M registers, rather than performing the add-compare-select operation on all the $2^M$ states, wherein some of bit values of the second possible state are the same as the rest of bit values after each shifting.

2. A receiving device, comprising:

a Viterbi decoder for receiving an output signal generated by a convolution code encoder processing an original signal, and using Viterbi algorithm to decode the output signal, wherein the convolution code encoder comprises M registers, M is a positive integer greater than or equal to 2; and a storage device storing an application program used for indicating a method of Viterbi algorithm for the Viterbi decoder to execute, the method comprises steps of:

performing, by the Viterbi decoder, an add-compare-select operation in the Viterbi algorithm for first to Mth data of the output signal, based on known M initial values of the M registers; and performing, by the Viterbi decoder, the add-compare-select operation in the Viterbi algorithm for Mth-last to last data of the output signal, based on known last M bits values of the original signal:

wherein the Viterbi decoder takes Radix-$2^i$ as radix, i is a positive integer greater than or equal to 1, and the step of performing, by the Viterbi decoder, the add-compare-select operation in the Viterbi algorithm for the first to the Mth data of the output signal based on the known M initial values of the M registers comprises a step of:

performing, by the Viterbi decoder, the add-compare-select operation for the first to the Mth data of the output signal by sequentially shifting the known M initial values of the known M registers out of the M registers by i and selecting a first possible state corresponding to the shifting from $2^M$ states included in the M registers, rather than performing the add-compare-select operation on all the $2^M$ states, wherein some of bit values of the first possible state are the same as the rest of bit values after each shifting;

wherein the step of performing, by the Viterbi decoder, the add-compare-select operation in the Viterbi algorithm for the Mth-last to the last data of the output signal based on the known last M bits values of the original signal comprises a step of:

performing, by the Viterbi decoder, the add-compare-select operation for the Mth-last to the last data of the output signal by sequentially shifting the known last M bits values of the original signal into the M registers by i and selecting a second possible state corresponding to the shifting from the $2^M$ states included in the M registers, rather than performing the add-compare-select operation on all the $2^M$ states, wherein some of bit values of the second possible state are the same as the rest of bit values after each shifting.

* * * * *